(12) United States Patent
Yoon

(10) Patent No.: US 8,232,592 B2
(45) Date of Patent: Jul. 31, 2012

(54) SEMICONDUCTOR DEVICE AND MANUFACTURING METHOD OF SEMICONDUCTOR DEVICE

(75) Inventor: Chul-Jin Yoon, Suwon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 415 days.

(21) Appl. No.: 12/634,168

(22) Filed: Dec. 9, 2009

(65) Prior Publication Data

US 2010/0140691 A1 Jun. 10, 2010

(30) Foreign Application Priority Data

Dec. 10, 2008 (KR) .......................... 10-2008-0125503

(51) Int. Cl.
*H01L 29/76* (2006.01)
(52) U.S. Cl. ... 257/329; 257/339; 257/342; 257/E21.41; 438/270; 438/272
(58) Field of Classification Search .................. 257/339, 257/330, 329, 342, E29.118, E29.257, E29.256, 257/E29.012, E21.41; 438/138, 268, 270, 438/272

See application file for complete search history.

(56) References Cited

U.S. PATENT DOCUMENTS 6,015,725 A * 1/2000 Hirayama ..................... 438/156
6,509,608 B1 * 1/2003 Hueting ........................ 257/330
\* cited by examiner

*Primary Examiner* — David Vu
(74) *Attorney, Agent, or Firm* — Sherr & Vaughn, PLLC

(57) ABSTRACT

A semiconductor device includes a semiconductor substrate in which a first trench is formed and a second trench is formed at the middle portions of the first trench; and a first ion implantation layer that is formed on the surface of the semiconductor substrate and on the bottom of the first trench, the portions formed on the bottom of the first trench being spaced from each other by the second trench. A gate is formed from the bottom of the both side walls of the first trench to the middle portions thereof; a drift region is formed at both side walls of the first trench over the second trench; and a second ion implantation layer formed on the inner surface of the second trench.

20 Claims, 3 Drawing Sheets

SEMICONDUCTOR DEVICE AND MANUFACTURING METHOD OF SEMICONDUCTOR DEVICE

This application claims the benefit under 35 U.S.C. §119 to Korean Patent Application No. 10-2008-0125503 (filed on Dec. 10, 2008), which is hereby incorporated by reference in its entirety.

BACKGROUND

Embodiments relate to a semiconductor device and a manufacturing method of the semiconductor device. A lateral double diffused metal oxide semiconductor (LDMOS) is a lateral power device having a rapid switching response and a high input impedance and is configured of a low voltage MOS (LV MOS), a high voltage drain extended MOS (HV DEMOS), etc. as a plurality of carrier devices.

In the case of the DEMOS, in order to process high voltage current, the distance between a gate electrode and a drain region is elongated or a device isolation layer for expanding drain is formed, thereby making breakdown voltage large. However, when an n-region is formed to be elongated between the gate electrode and the drain region, it is difficult to minimize the size of the device when a photolithograpy process is performed to form an n-region ion implantation mask. The mask alignment work is a relatively fine process, introducing many difficulties.

Moreover, when the device isolation layer for expanding drain is formed, problems arise in that on-resistance $R_{on}$ is increased and current driving ability is significantly reduced. In particular, in the device isolation layer for expanding a drain, a portion adjacent to the gate electrode is weak against high voltage current and a surface breakdown phenomenon may be generated, if an electric field is concentrated thereon.

SUMMARY

Embodiments relate to a semiconductor device that can minimize the size of the device, easily control the distance between a gate and a drain determining breakdown voltage, and improve the breakdown voltage, and a manufacturing method of the semiconductor device.

A semiconductor device according to embodiments includes: a semiconductor substrate in which a first trench is formed and a second trench is formed at the middle portions of the first trench; a first ion implantation layer that is formed on and/or over the surface of the semiconductor substrate and on and/or over the bottom of the first trench, the portions formed on and/or over the bottom of the first trench being spaced from each other by the second trench; a second gate formed from the bottom of the both side walls of the first trench to the middle portions thereof; a drift region formed at both side walls of the first trench over the second trench; and a second ion implantation layer formed on and/or over the inner surface of the second trench.

A manufacturing method of a semiconductor device according to embodiments includes: forming a first trench on and/or over a semiconductor substrate; forming a first ion implantation layer on and/or over the surface of the semiconductor substrate and on and/or over the bottom of the first trench; forming a second gate from the bottom of the both side walls of the first trench to the middle portions thereof, and forming a second trench penetrating through the middle portions of the first ion implantation layer of the bottom of the first trench; forming a drift region on and/or over both side walls of the first trench over the second trench; and forming a second ion implantation layer on and/or over the inner surface of the second trench.

DRAWINGS

DESCRIPTION

A semiconductor device and a manufacturing method of the semiconductor device according to embodiments will be described with reference to the accompanying drawings, wherein the semiconductor device according to embodiments may be DEMOS.

Hereinafter, in explaining embodiments, any function or constitution well-known to the technical field to which embodiments pertain may unnecessarily obscure understanding of the explanation; thus the description focuses on the core constitution units most helpful in understanding the embodiments described.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
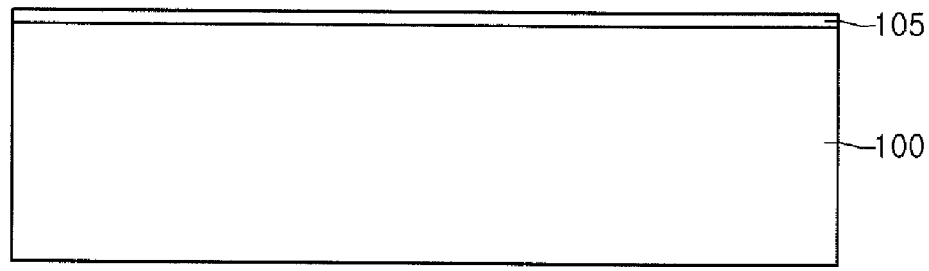
FIG. 1 is a side cross-sectional view showing the shape of a semiconductor device after a pad oxide layer according to embodiments is formed.

FIG. 1 is a side cross-sectional view showing the shape of a semiconductor device after a pad oxide layer 105 according to embodiments is formed. First, the pad oxide layer 105 may be formed over a semiconductor substrate 100, for example, a silicon wafer substrate in a single crystal state, by processing an oxidation process.

Figure 2:
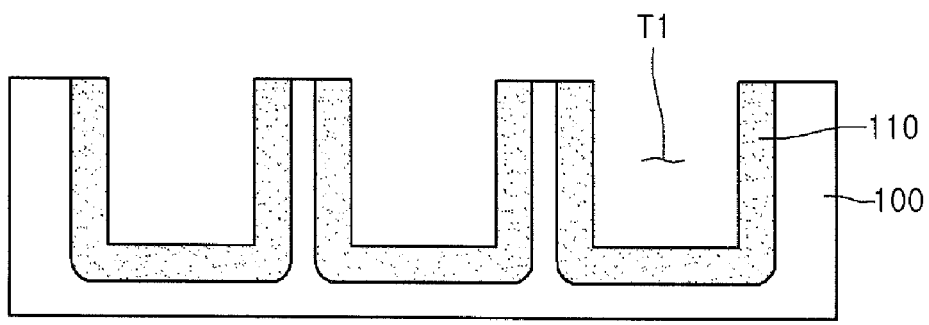
FIG. 2 is a side cross-sectional view showing the shape of the semiconductor device after a well region according to embodiments is formed.

FIG. 2 is a side cross-sectional view showing the shape of a semiconductor device after a well region 110 according to embodiments is formed. A photoresist pattern that defines a first trench T1 region may be formed on the pad oxidation layer 105, and the pad oxidation layer 105 is patterned using the photoresist pattern as an etching mask. If the pad oxidation layer 105 is patterned, the photoresist pattern may be removed and then the semiconductor substrate 100 may be etched using the patterned pad oxidation layer 105 as a hard mask. Therefore, the first trench T1 is formed, as shown in FIG. 2.

For example, the first trench T1 may be formed at a depth of about 6000'. Thereafter, the pad oxidation layer 105 may be removed. A photoresist pattern that allows only a portion of the semiconductor substrate 100 on side surface of the first trench T1 to be opened is formed and an ion implantation process may be performed on the photoresist pattern using an ion implantation mask, thereby forming the well region 110 having a predetermined thickness in the inner surface of the trench T1. Therefore, well regions 110 on the trench T1 may have a shape spaced from each other. Afterwards, the photoresist pattern may be removed.

Figure 3:
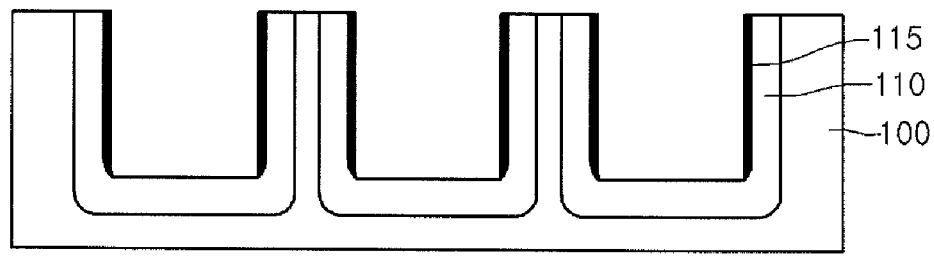
FIG. 3 is a side cross-sectional view showing the shape of the semiconductor device after a voltage match region according to embodiments is formed.

FIG. 3 is a side cross-sectional view showing the shape of a semiconductor device after a voltage match region 115 is formed according to embodiments. A photoresist pattern is formed on the surface of the semiconductor substrate 100 from which the first trench T1 region is excluded, and an ion implantation process is performed using the photoresist pattern as an ion implantation mask. Accordingly, ions may be implanted into only the side walls of the first trench T1 by tilting the implantation angle; thereby forming voltage match region 115 on both side walls of the first trench T1.

When a semiconductor device according to embodiments is an N type DEMOS, the voltage match region 115 may be formed, for example, using boron and ion. At least one purpose of the voltage match region 115 is to substantially match the levels of the threshold voltage of the semiconductor device with a predetermined value. Afterwards, the photoresist pattern may be removed.

Figure 4:
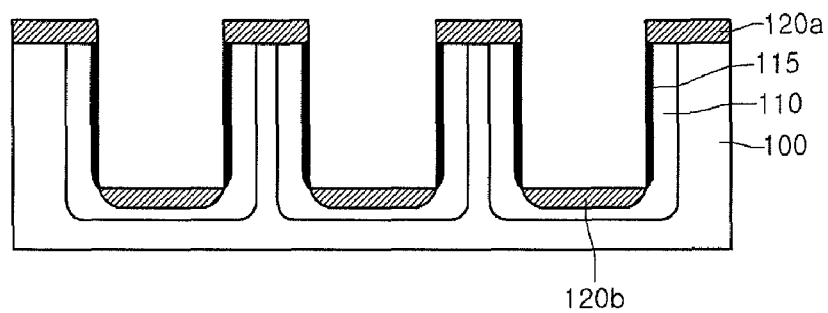
FIG. 4 is a side cross-sectional view showing the shape of the semiconductor device after first ion implantation layers according to embodiments are formed.

FIG. 4 is a side cross-sectional view showing the shape of a semiconductor device after first ion implantation layers 120a and 120b according to embodiments are formed. Ions may be implanted vertically from the top side of the semiconductor substrate 100 in a blanket scheme to form the first ion implantation layers 120a and 120b on and/or over the top surface of the semiconductor substrate 100 excepting the trench T1 and the bottom surface of the first trench T1, respectively.

The first ion implantation layer 120a formed on and/or over the top surface of the semiconductor substrate 100 may function as a drain region and the first ion implantation layer 120b formed on and/or over the bottom surface of the first trench T1 may function as a source region. Hereinafter, for convenience of explanation, the first ion implantation layer 120a formed on and/or over the top surface of the semiconductor substrate 100 will be referred to as a "drain region", and the first ion implantation layer 120b formed on and/or over the bottom surface of the first trench T1 will be referred to as a "source region".

Figure 5:
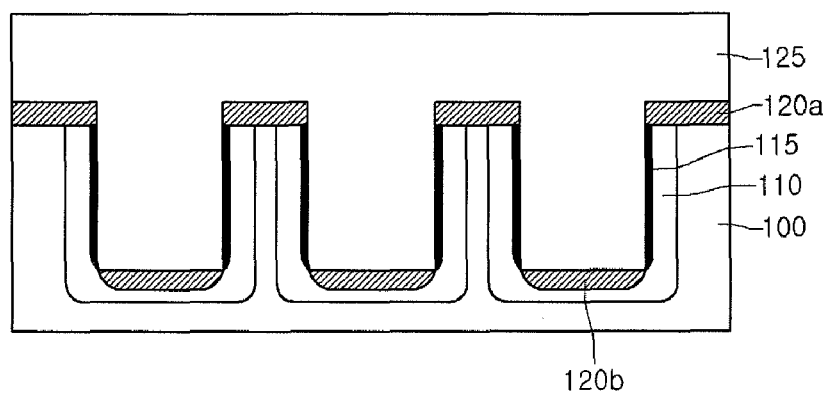
FIG. 5 is a side cross-sectional view showing the shape of the semiconductor device after a polysilicon layer according to embodiments is formed.

FIG. 5 is a side cross-sectional view showing the shape of a semiconductor device after a polysilicon layer 125 is formed according to embodiments. A polysilicon layer 125 may be formed over the semiconductor substrate 100 including the drain region 120a and the source region 120b by burying the first trench T1.

Figure 6:
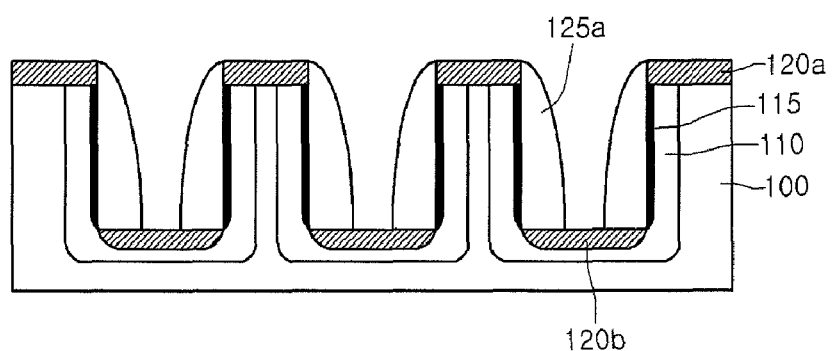
FIG. 6 is a side cross-sectional view showing the shape of the semiconductor device after a first gate according to embodiments is formed.

FIG. 6 is a side cross-sectional view showing the shape of a semiconductor device after a first gate 125a is formed according to embodiments. If the polysilion layer 125 is formed, the polysilicon layer 125 may be etched so that a drain region 120a and a source region 120b are exposed. Because the etching selectivity on the side wall portions of the first trench T1 may be different from that on other regions, the polysilicon layer may remain on the side walls of the trench T1, thereby making it possible to form the shape of a first gate 125a.

Figure 7:
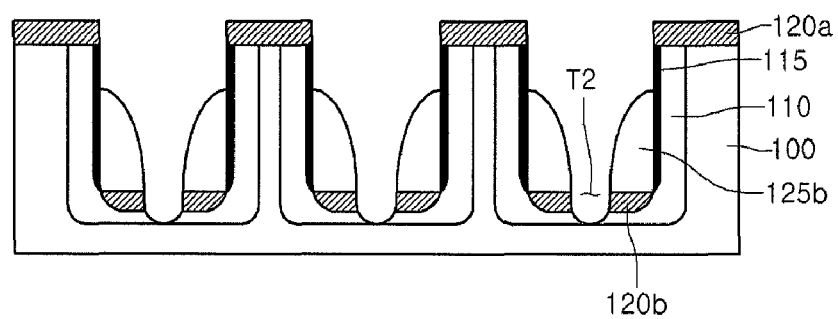
FIG. 7 is a side cross-sectional view showing the shape of the semiconductor device after a second gate according to embodiments is formed.

FIG. 7 is a side cross-sectional view showing the shape of a semiconductor device after a second gate 125b is formed according to embodiments. A photoresist pattern may be formed over the drain region 120a and an etch process may use the photoresist pattern as a mask. The first gate 125a may be etched to the middle portions of the side walls of the first trench T1 by controlling process conditions such as etching time, amount of ejected gas, etc. Therefore, the first gate 125a may form the shape of the second gate 125b, as shown in FIG. 7. Moreover, through the etch process, the middle portions of the source region 120b may be removed and the semiconductor substrate under the source region 120b may be further etched, thereby forming a second trench T2. It may be beneficial in embodiments that the second trench T2 is formed to be deeper than the well region 110.

Figure 8:
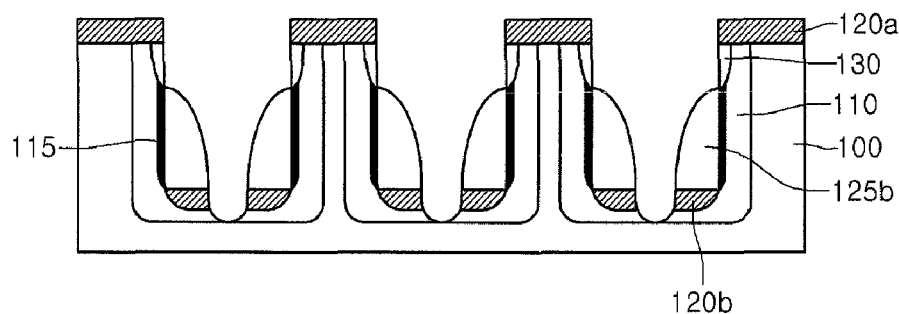
FIG. 8 is a side cross-sectional view showing the shape of the semiconductor device after a drift region according to embodiments is formed.

FIG. 8 is a side cross-sectional view showing the shape of a semiconductor device after a drift region 130 is formed according to embodiments. The photoresist pattern used in foaming the second gate 125b may also be used as an ion implantation mask in performing an ion implantation process. For example, ions may be implanted into only the side walls of the first trench T1 by tiling the implantation angle so that the drift region 130 can be formed as shown in FIG. 8. In other words, the drift region 130 may be formed at side walls between the second gate 125b and the drain region 120a among both side walls of the first trench T1.

The drift region 130 may space the second gate 125b and the drain region 120a to be far enough apart that the semiconductor device according to embodiments can be operated as a relatively high voltage device. Thereafter, the photoresist pattern may be removed.

Figure 9:
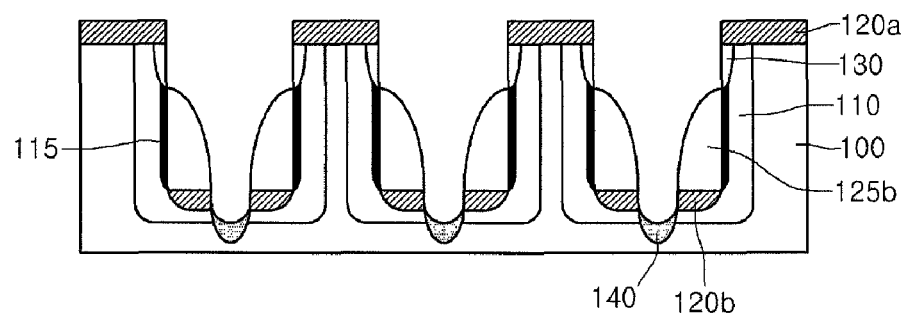
FIG. 9 is a side cross-sectional view showing the shape of the semiconductor device after a device isolation region according to embodiments is formed.

FIG. 9 is a side cross-sectional view showing the shape of a semiconductor device after a device isolation region 140 is formed according to embodiments. An ion implantation process, such as a blanket scheme, may be performed to form a second ion implantation layer in the inner surface of the second trench T2. The second ion implantation layer may function as the device isolation region 140. Therefore, the source region 120b, the second gate 125b, the drift region 130, and the drain region 120a on one side of the device isolation region 140 constitute one semiconductor device.

According to embodiments, more semiconductor devices can be integrated on small area. Moreover, the depth of the first trench T1 and the height of the second gate 125b may be controlled, thereby making it possible to easily control the position and size of the drift region 130.

Afterwards, a silicide layer for example may be formed on the exposed surface of the drain region 120a, the second gate 125b, and the source region 120b, and the first trench T1 and the second trench T2 are buried, thereby forming a dielectric layer over the semiconductor substrate 100. Thereafter, a contact plug process, a metal wiring process, an electrode process, etc. may further be processed.

The embodiments described above have at least some of the following characteristics. First, the drain and the gate may be implemented having a vertical structure on the trench, escaping from the structure where the drain is formed to be far from the gate side in the related devices, making it possible to minimize a size of the device and to easily control the distance between the gate and the drain determining the breakdown voltage.

Second, there has been difficulty in forming an n-region between a gate and a drain at a certain position and at a certain size due to the difficulty in a photo process, an ion implantation process, and an annealing process. However, according to embodiments, a drift region between a gate and a drain may be formed using a self alignment scheme without a photoresist pattern process, making it possible to constantly and consistently form the position and the size of the drift region.

Third, the breakdown voltage can be maximized by preventing the surface breakdown phenomenon due to the electric field concentration and minimizing the on-resistance, making it possible to maximize the current driving ability of a DEMOS device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method, comprising:
   forming a first trench over a semiconductor substrate;
   forming a first ion implantation layer over a surface of the semiconductor substrate and over a bottom of the first trench;
   forming a second gate from substantially a respective bottom of each side wall of the first trench to a respective middle portion thereof, and forming a second trench penetrating through a portion of the first ion implantation layer over the bottom of the first trench;
   forming a respective drift region over each side wall of the first trench over the second trench; and
   forming a second ion implantation layer over the inner surface of the second trench.

2. The method of claim 1, wherein the forming the first trench includes:
   forming a pad oxide layer over the semiconductor substrate;
   forming a photoresist pattern that defines a first trench region over the pad oxide layer and removing the photoresist pattern after the pad oxide layer is patterned, thereby forming a patterned pad oxide layer;
   forming the first trench by etching the semiconductor substrate using the patterned pad oxide layer as a mask; and
   removing the patterned pad oxide layer.

3. The method of claim 2, comprising:
   forming a voltage match region at both side walls of the first trench.

4. The method of claim 3, wherein the forming the voltage match region comprises:
   forming a photoresist pattern over the semiconductor substrate from which the first trench region is excluded; and
   forming the voltage match region by using the photoresist pattern as an ion implantation mask and processing an ion implantation process by tilting an ion implantation angle towards the both side walls of the first trench.

5. The method of claim 1, wherein at least one of the first ion implantation layer and the second ion implantation layer is formed through an ion implantation process in a blanket scheme.

6. The method of claim 1, wherein forming the second gate and forming the second trench includes:
   forming a polysilicon layer over the semiconductor substrate by burying the first trench;
   etching the polysilicon layer so that the first ion implantation layer is exposed and the polysilicon layer remains at both side walls of the first trench to form a first gate; and
   forming the second gate by etching the first gate to the respective middle portion.

7. The method of claim 6, wherein forming the second gate comprises:
   forming a photoresist pattern over the first ion implantation layer formed over the surface of the semiconductor substrate;
   etching the first gate to the respective middle portion by performing an etch process using the photoresist pattern as a mask and controlling process conditions including etch time and amount of injected gas; and
   removing the photoresist pattern.

8. The method of claim 1, comprising:
   forming a well region over an inner surface of the first trench.

9. The method of claim 8, wherein the second trench is formed to be deeper than the well region.

10. The method of claim 1, wherein the forming the drift region comprises:
    forming a photoresist pattern over the first implantation layer formed over the surface of the semiconductor substrate;
    forming the drift region by using the photoresist pattern as a mask and processing an ion implantation process by tilting an ion implantation angle towards the both side walls of the first trench; and
    removing the photoresist pattern.

11. The method of claim 1, comprising:
    forming a silicide layer over exposed surfaces of the first ion implantation layer and the second gate.

12. The method of claim 1, wherein forming a first trench over a semiconductor substrate, comprises:
    forming the first trench on the semiconductor substrate.

13. The method of claim 1, wherein forming a first ion implantation layer over a surface of the semiconductor substrate and over a bottom of the first trench, comprises:
    forming the first ion implantation layer on the surface of the semiconductor substrate and on the bottom of the first trench.

14. The method of claim 1, wherein forming a second ion implantation layer over the inner surface of the second trench, comprises:
    forming the second ion implantation layer on the inner surface of the second trench.

15. An apparatus comprising:
    a semiconductor substrate in which a first trench is formed and a second trench is formed at a middle portion of the first trench;
    a first ion implantation layer that is formed over a surface of the semiconductor substrate and over a bottom of the first trench, wherein each portion of the first ion implantation layer formed on the bottom of the first trench being spaced from each other by the second trench;
    a second gate formed from a respective bottom of each side wall of the first trench to a respective middle portion thereof;
    a respective drift region formed at each side wall of the first trench over the second trench; and
    a second ion implantation layer formed on an inner surface of the second trench.

16. The apparatus of claim 15, comprising:
    a well region formed over an inner surface of the first trench.

17. The apparatus of claim 16, wherein the well region is formed at a depth substantially the same as the second trench.

18. The apparatus of claim 16, wherein the well region is formed at a depth shallower than the second trench.

19. The apparatus of claim 15, comprising:
    a respective voltage match region formed at each side wall of the first trench.

20. The apparatus of claim 15, further comprising:
    a silicide layer formed on exposed surfaces of the first ion implantation layer and the second gate.

* * * * *